(12) United States Patent
Pasquier et al.

(10) Patent No.: US 7,126,503 B2
(45) Date of Patent: Oct. 24, 2006

(54) DIGITAL SAMPLING FREQUENCY CONVERTER

(75) Inventors: Laurent Pasquier, Asnieres-sur-Seine (FR); Marc Duranton, Eindhoven (NL); Qin Zhao, Charenton le Pont (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/539,197

(22) PCT Filed: Dec. 5, 2003

(86) PCT No.: PCT/IB03/05813

§ 371 (c)(1),
(2), (4) Date: Jun. 17, 2005

(87) PCT Pub. No.: WO2004/055983

PCT Pub. Date: Jul. 1, 2004

(65) Prior Publication Data

US 2006/0132172 A1  Jun. 22, 2006

(30) Foreign Application Priority Data

Dec. 18, 2002 (FR) .................................. 02 16098

(51) Int. Cl.
*H03M 7/00* (2006.01)

(52) U.S. Cl. .......................... 341/61; 341/50; 703/313; 703/316; 703/319

(58) Field of Classification Search ................ 708/300, 708/301, 313, 316, 319; 341/50, 61
See application file for complete search history.

(56) References Cited

U.S. PATENT DOCUMENTS

| | | | | |
|---|---|---|---|---|
| 5,023,825 A * | 6/1991 | Luthra et al. | ................ | 708/313 |
| 5,103,416 A * | 4/1992 | Cavallotti et al. | .......... | 708/319 |
| 5,621,404 A * | 4/1997 | Heiss et al. | .................... | 341/61 |
| 5,892,695 A * | 4/1999 | Van Dalfsen et al. | ....... | 708/313 |
| 6,584,145 B1 * | 6/2003 | Camagna et al. | ........... | 375/216 |
| 6,963,890 B1 * | 11/2005 | Dutta et al. | ................. | 708/319 |
| 2002/0184275 A1 | 12/2002 | Dutta et al. | | |
| 2003/0102991 A1 * | 6/2003 | Pasquier | ....................... | 341/61 |

FOREIGN PATENT DOCUMENTS

CA  2144111  9/1996

* cited by examiner

Primary Examiner—Rexford Barnie
Assistant Examiner—Khai Nguyen

(57) ABSTRACT

The present invention relates to a converter converting an input digital signal into an output digital signal. Said converter comprises in particular a set of shift registers able to contain samples of the input or output digital signal. It also comprises a calculation unit able to supply a shift signal (4) to said set of registers. Said calculation unit comprises a first storage unit (51) able to contain a value of a conversion ratio or of its inverse, so that the value stored is between 0 and 1. It also comprises a second storage unit (52) able to contain, at a cycle time i+1, i being an integer, a future signal (8) equal to a sum of a current signal (7) contained in the second unit at a cycle time i and of the content of the first storage unit. The shift signal then results from an exclusive OR function (54) between a most significant bit of the current signal (71) and a most significant bit of the future signal (81).

6 Claims, 3 Drawing Sheets

DIGITAL SAMPLING FREQUENCY CONVERTER

RELATED APPLICATION

This application is a 371 of PCT/IB03/05813 filed Jan. 5, 2003 which claims priority to French Application No. 02169098 filed Jan. 18, 2003.

FIELD OF THE INVENTION

The present invention relates to a converter for converting an input digital signal into an output digital signal, said converter comprising a set of shift registers able to contain samples of the input or output digital signal.

It also relates to a method of converting an input digital signal into an output digital signal.

It finds its application in particular in digital television receivers, for example in a conversion of the image format.

BACKGROUND OF THE INVENTION

In many video systems, it is often necessary to effect a conversion of a digital signal from a first sampling frequency to a second sampling frequency, according to the image format required by the reception device. The conversion results in an enlargement or reduction of the original image corresponding to a up-sampling or a down-sampling of said image.

Such a conversion can be implemented by means of a finite impulse response filter FIR with a polyphase structure. Canadian patent number 2,144,111 describes a conversion method using such a filter. The term polyphase indicates a periodic representation of the phase differences between a sample of the input digital signal and a sample of the output digital signal. These phase differences are calculated according to the inverse of a zoom factor, the zoom factor representing the ratio between the number of samples of the output signal and the number of samples of the input signal. The polyphase filter functions in direct mode for an enlargement of the image, i.e. for a zoom factor greater than 1, and in transposed mode for a reduction of the image, i.e. for a zoom factor lower than 1.

A conventional polyphase filter comprises a convoluter able to supply an output digital signal sampled at a frequency f2 from an input digital signal sampled at a frequency f1 and a set of filtering coefficients. A memory associates with each possible phase difference a set of n filtering coefficients. The convoluter comprises shift registers for temporarily storing the samples of the input signal in the direct operating mode of the polyphase filter or the samples of the output signal in its transposed operating mode. Calculation means calculate on the one hand the phase difference and on the other hand the shift signal of the shift registers.

A polyphase filter of this type is specifically designed firstly for a predetermined number of n filtering coefficients per set and secondly for a direct or transposed operating mode. The shift signal is calculated by successive incrementation of the inverse of the zoom factor, this calculation being carried out by a calculation unit dedicated to a given polyphase filter. Consequently said calculation unit is designed specifically for this polyphase filter and cannot be used for another polyphase filter.

SUMMARY OF THE INVENTION

It is an object of the present invention to propose a conversion method and device as described in the introductory paragraph, which is able to generate a single shift signal for different numbers n of filtering coefficients, and for direct and transposed operating modes.

To this end, the conversion device according to the invention is characterized in that it comprises a calculation unit able to supply a shift signal to the set of registers and comprising a first storage unit able to contain a value of a conversion ratio or of its inverse, so that the stored value is between 0 and 1, a second storage unit able to contain, at a cycle time i+1, i being an integer, a future signal equal to a sum of a current signal contained in the second unit at a cycle time i and the content of the first storage unit, the shift signal resulting from an exclusive OR function between a most significant bit of the current signal and a most significant bit of the future signal.

Thus, when the calculation unit is activated, the second storage unit is incremented or decremented at each cycle time by the value contained in the first storage unit. The shift signal then results from an exclusive OR between the integer part of a position of a sample at a cycle time i+1 and the integer part of a position of a sample at a cycle time i. This means that each time a carry is delivered, i.e. an integer part of a current or future signal is equal to 1, the shift signal is at its high level.

Thus a single wiring is necessary for the calculation unit, said unit also being independent of the polyphase filter and being able to be used by any type of polyphase filter whatever their number n of filtering coefficients or their operating mode. In addition, as will be seen in detail in the description, only a few signals are necessary in order to synchronize the shift signal delivered by this calculation unit.

BRIEF DESCRIPTION OF THE DRAWINGS

The invention will be further described with reference to examples of embodiments shown in the drawings to which, however, the invention is not restricted.

DESCRIPTION OF PREFERRED EMBODIMENTS

The present invention relates to a converter for converting an input digital signal into an output digital signal, comprising a filter used in polyphase structure. It has been developed in the case of a video data format conversion, the digital signal comprising samples of the pixel type, but remains applicable to other types of data such as audio data for example. In the case of video data, the pixel values which are filtered are, for example, luminance and chrominance data.

Figure 1:
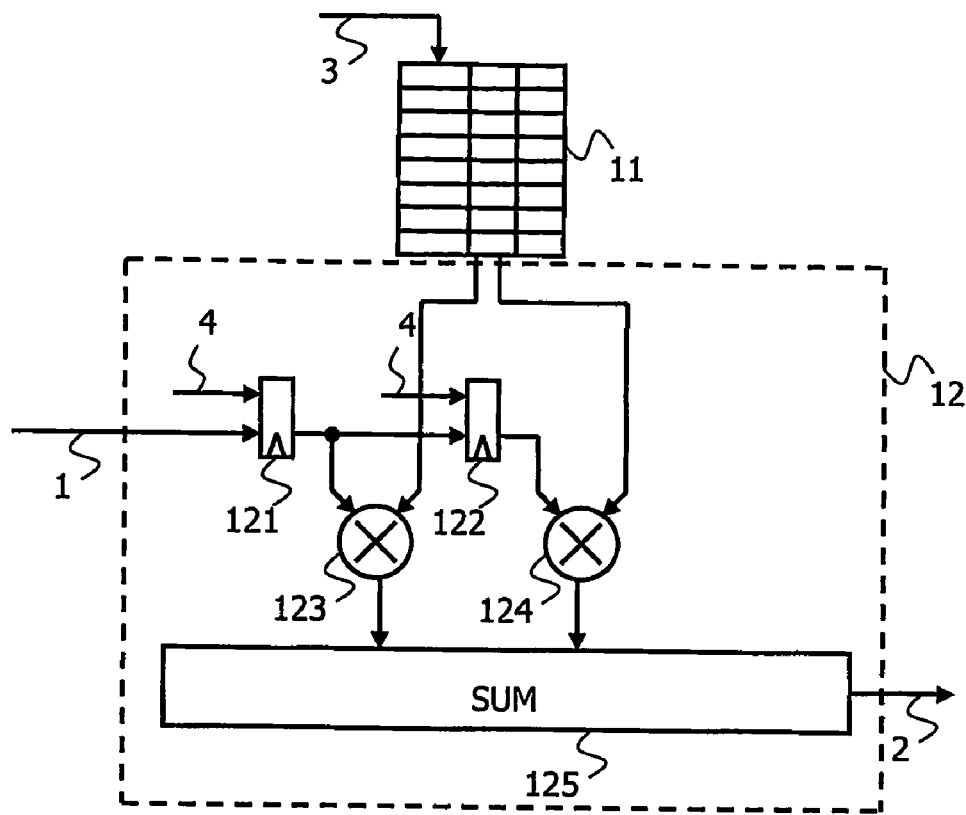
FIG. 1 is a diagram representing the direct operating mode of a two-coefficient polyphase filter.

The functioning of a polyphase filter is described with reference to FIGS. 1 and 3 in direct and transposed functioning mode, respectively. The polyphase filter comprises a convoluter (12, 14) and a memory (11, 13). The memory (11, 13) contains a set of n filtering coefficients for each value taken by a phase difference (3) between a pixel of the output digital signal and a pixel of the input digital signal.

In direct functioning mode, the convoluter (12) comprises two shift registers (121, 122) able to shift a pixel of the input signal (1) when they are activated by a shift signal (4). It also comprises an adding device SUM (125) able to add together the products coming from multipliers (123, 124), a multiplier being able to effect the product of a value of a pixel of the input signal and a filter coefficient corresponding to it for a given phase difference (3), in order to deliver a pixel of the output signal (2).

Figure 2:
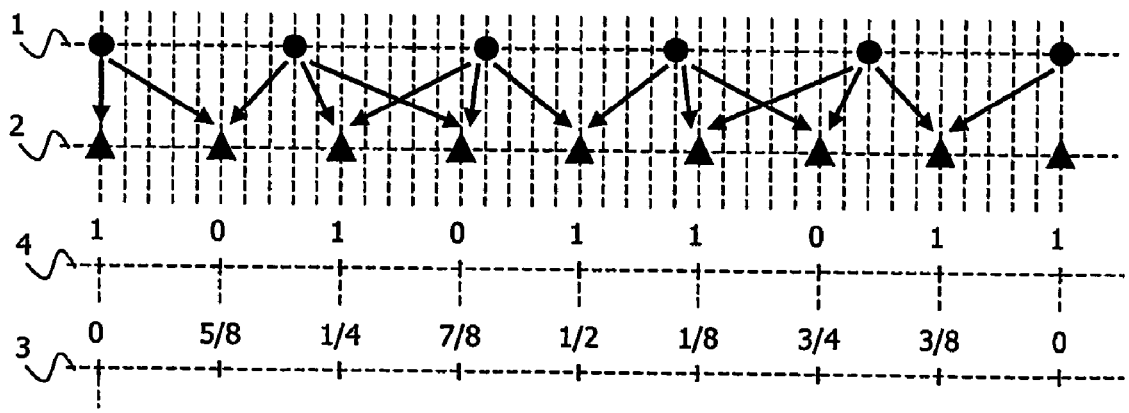
FIG. 2 illustrates the determination of the shift signal and of the phase difference in the direct mode.

FIG. 2 illustrates the functioning of the polyphase filter in direct mode in the case of a zoom factor of 8/5, therefore corresponding to a ratio of the frequency f2 of the output digital signal to the frequency f1 of the input digital signal of 8/5. In this case, the number n of filtering coefficients per set is equal to 2.

At a time t, the phase difference (3) is equal to 0 and the shift signal (4) is equal to 1. The first (121) and second (122) shift registers contain, after shifting, the values of the second and first input pixels ip2 and ip1, respectively. The filtering coefficients are 0 and 1, respectively. As a result the value of the first pixel op1 of the output signal (2) is equal to the value of the first pixel ip1 of the input signal (1).

The inverted zoom factor is equal to 0.625 or ⅝. At the following cycle time t+1, the phase difference is therefore equal to ⅝ after incrementation and the shift signal is equal to 0. The first and second shift registers therefore always contain the values of the second and first input pixels ip2 and ip1, respectively. As a result the value of the second output signal op2 is equal to the sum of the products of the values of the input pixels ip1 and ip2 and the two filtering coefficients corresponding to the phase difference of ⅝.

At the following cycle time t+2, after a new incrementation of the zoom factor, the position of the second output pixel op2 in the grid of the input pixels has an integer part equal to 1 and a fractional part equal to ¼, which corresponds to a shift signal equal to 1 and a phase difference equal to ¼. The first and second shift registers therefore contain, after shifting, the values of the third and second input pixels ip3 and ip2, respectively. As a result the value of the third output pixel op3 is equal to the sum of the products of the values of the input pixels ip2 and ip3 and the two filtering coefficients corresponding to the phase difference of ¼.

By repeating the operation, a periodic series of 8 phase differences equal to {0 ⅝ ¼ ⅞ ½ ⅛ ¾ ⅜} and 8 output pixel for 5 input pixels is obtained.

In the direct functioning mode, it can be observed that the shift signal is activated whenever an input pixel has finished contributing to all the output pixels to which it has to contribute.

Figure 3:
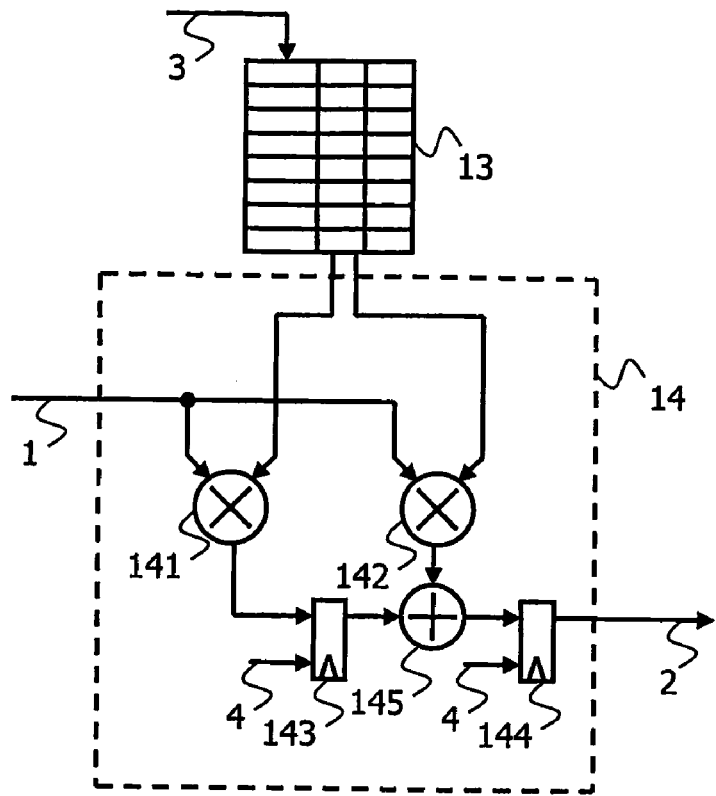
FIG. 3 is a diagram representing the transposed operating mode of a two-coefficient polyphase filter.

In the transposed functioning mode described in FIG. 3, the convoluter (14) comprises two multipliers (141, 142) able to effect the product of a filtering coefficient issuing from the memory (13) and a current pixel of the input digital signal. The output of the first multiplier (141) is connected to the input of a first shift register (143). An adder (145) is able to effect a sum of the values issuing from the first shift register and a second multiplier (142) and supplies a value of a pixel of the output digital signal (2) which is temporarily stored in a second shift register (144). The shift registers can be activated by a shift signal (4).

Figure 4:
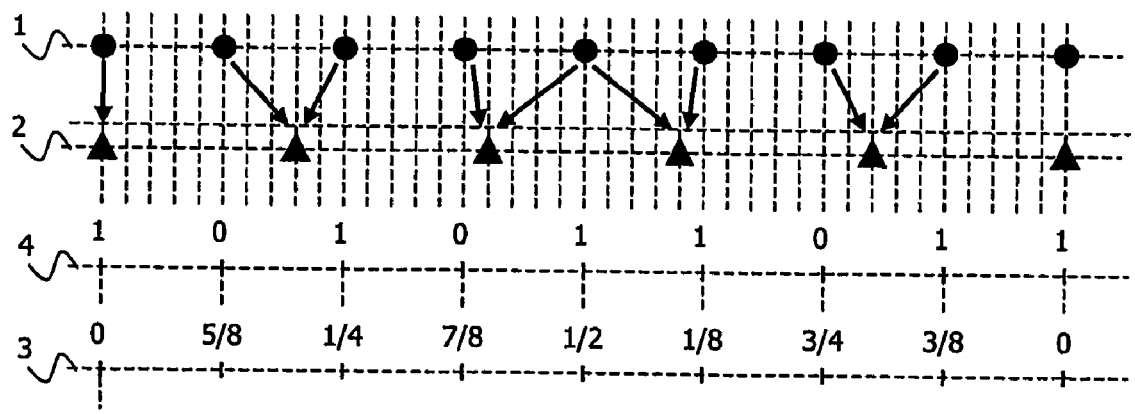
FIG. 4 illustrates the determination of the shift signal and of the phase difference in the transposed mode.

FIG. 4 illustrates the functioning of the polyphase filter in transposed mode in the case of a zoom factor of ⅝, corresponding therefore to a ratio of the frequency f2 of the output digital signal to the frequency f1 of the input digital signal of ⅝. In this case, the number n of filtering coefficients per set is still equal to 2.

The transposed functioning mode illustrates the fact that it is not possible to use the position of the output pixels in the grid of input pixels for generating the shift signal. The solution therefore consists of incrementing or decrementing the zoom factor rather than the inverse zoom factor as in the direct functioning mode.

Thus, at a time t, the phase difference (3) is equal to 0 and the shift signal (4) is equal to 1. The second shift register (144) contains, after shifting, the value of the product of the value of the first input pixel ip1 and a filtering coefficient equal to 1. The result is that the value of the first output pixel op1 is equal to the value of the first input pixel ip1.

The zoom factor is equal to 0.625 or ⅝. At the following cycle time t+1, the phase difference is therefore equal, after incrementation, to ⅝ and the shift signal is equal to 0. The first shift register (143) then contains the product of the value of the second input pixel ip2 and a filtering coefficient corresponding to the phase difference of ⅝.

At the following cycle time t+2, after a new incrementation of the zoom factor, the position of the third input pixel ip3 in the grid of the output pixels has an integer part equal to 1 and a fractional part equal to ¼, which corresponds to a shift signal equal to 1 and to a phase difference equal to ¼. The content of the first shift register is shifted and added to the product of the value of the third input pixel ip3 and a filtering coefficient corresponding to the phase difference of ¼, and is then stored in the second shift register. The value of the second output pixel op2 is then equal to the content of the second shift register.

By repeating the operation, a periodic series of 8 phase differences equal to {0 ⅝ ¼ ⅞ ½ ⅛ ¾ ⅜} and 5 output pixels for 8 input pixels is obtained.

Figure 5:
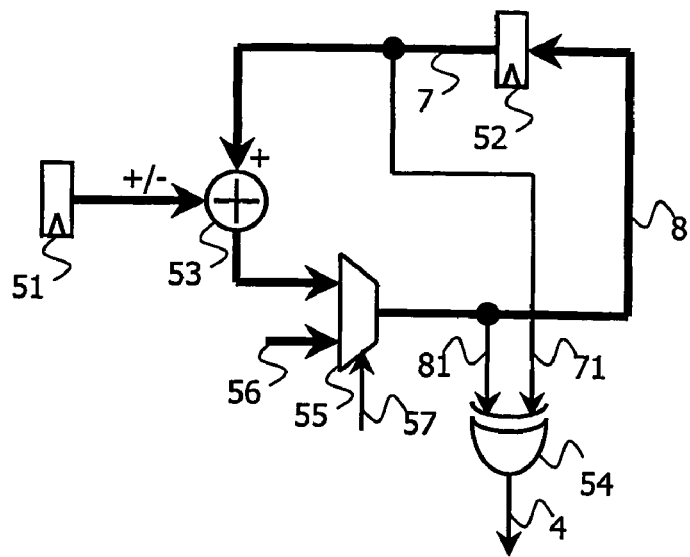
FIG. 5 is a diagram depicting a unit for calculating the shift signal according to the invention.

FIG. 5 describes a calculation unit according to the invention, able to supply a single shift signal to the set of shift registers.

Said unit also comprises a first storage unit, a first set of k shift registers (51) for example, able to receive a conversion ratio, a value of said ratio or of its inverse being between 0 and 1.

It comprises a second storage unit, a second set of k shift registers (52) for example, able to contain a position of a pixel of the output signal within a grid of samples of the input signal in direct mode or of a pixel of the output signal with a grid of the samples of the input signal in transposed mode. The value of the content of the second storage unit is between 0 and 2.

The calculation unit comprises an adder (53) able to effect a sum, an addition or subtraction depending on whether the unit is functioning in incrementation or decrementation mode, of the content of the first set of shift registers (51) to the content of the second set of shift registers (52). By way of example, the contents of the sets of registers are represented in k=24 bits, the number bit k−1=23 representing the integer part of the position of the pixel and the bits 0 to k−2=22 representing the fractional part of said position.

The calculation unit also comprises a multiplexer (55) for initializing the second set of k shift registers. This multiplexer has as its inputs the output of the adder (53) and an initialization signal (56), a selection signal (57) selecting the initialization signal at the start of the processing of the input signal, for example at the start of the processing of an image, and then selecting the signal issuing from the adder. The value of the selection signal is substantially less than 1.0 in the case of a decrementation, for example 7FFFFF in the example where k=24, and 0.0 in the case of an incrementation.

Finally, it comprises a circuit performing the "exclusive OR" function (54) between the integer part of the content of the second set of registers (52) at a cycle time i and the integer part of the content of said set at a cycle time i+1. This means that each time a carry, i.e. an integer part equal to 1, is delivered by the adder (53), the shift signal is at its high state.

Figure 6:
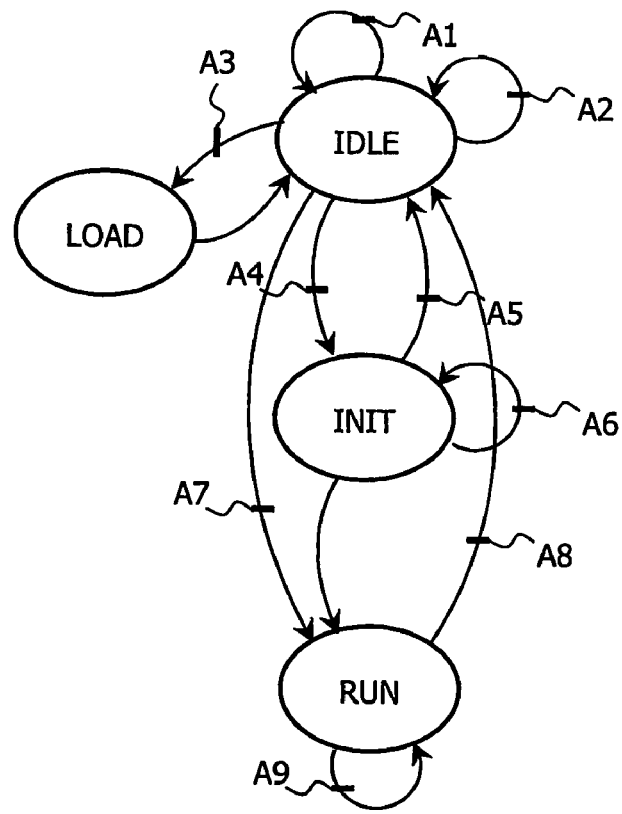
FIG. 6 is a state diagram illustrating the functioning of said calculation unit.

FIG. 6 is a state diagram illustrating the functioning of the shift signal calculation unit. This diagram comprises an idle state IDLE, an initialization state TNIT, a loading state LOAD for the zoom factor or its inverse according to the functioning mode chosen, and an execution state RUN.

The calculation unit remains in the idle state in the absence of operation (A1). The idle state is able to take into account a new number n of filtering coefficients (A2). The idle state is also able to take into account a new zoom factor or its inverse (A3).

The initialization state is activated when the transposed mode of functioning of the filter is chosen (A4), in order to load the value 7FFFFF into the second set of shift registers (52). It returns (AS) to the idle state at the end of the processing according to this functioning mode. The initialization state is once again activated when the number of filtering coefficients is greater than 2 (A6).

The state INIT is activated when the direct functioning mode is chosen (A7). When the diagram is in the execution state, the second set of shift registers is incremented or decremented at each cycle time (A9). At the end of the processing according to this functioning mode, the calculation unit returns (A8) to the idle state.

Finally, the present invention relates to a digital television receiver comprising a converter according to the invention for modifying the image format, the modification being able to be a change in format, from 4/3 format to 16/9 format for example, or a fine tuning of the image resolution.

No reference sign between parentheses in the present text should be interpreted limitingly. The verb "comprise" and its conjugations should also be interpreted broadly, that is to say as not excluding the presence not only of elements or steps other than those listed after the verb but also of a plurality of elements or steps already listed after said verb and preceded by the word "a", "an" or "one".

The invention claimed is:

1. A converter for converting an input digital signal into an output digital signal (2), said converter comprising:
    a set of shift registers able to contain samples of the input or output digital signal,
    a calculation unit able to supply a shift signal to said set of registers and comprising:
        a first storage unit able to contain a value of a conversation ratio or of its inverse, so that the stored value is between 0 and 1,
        a second storage unit able to contain, at a cycle time i+1, i being an integer, a future signal equal to a sum of a current signal contained in the second unit at a cycle time i and of the content of the first storage unit, the shift signal resulting from an exclusive OR function between a most significant bit of the current signal and a most significant bit of the future signal.

2. A digital television receiver comprising a converter as claimed in claim 1.

3. A calculation unit able to supply a shift signal to set of shift registers of a converter converting an input digital signal into an output digital signal and comprising:
    a first storage unit able to contain a value of a conversion ratio or of its inverse, so that the stored value is between 0 and 1,
    a second storage unit able to contain, at a cycle time i+1, i being an integer, a future signal equal to a sum of a current signal contained in the second unit at a cycle time i and of the content of the first storage unit, the shift signal resulting from an exclusive OR function between a most significant bit of the current signal and a most significant bit of the future signal.

4. A calculation unit as claimed in claim 3, comprising an initialization circuit able to load an initialization signal into the second storage unit at the start of a processing of the input digital signal.

5. A method of converting an input digital signal into an output digital signal, said method comprising the calculation step able to supply a shift to a set of shift registers, itself comprising the substeps of:
    storage of a value of a conversion ratio or of its inverse, so that the value stored is between 0 and 1,
    addition or subtraction of the value of the value previously stored to or from a current signal initially equal to an initialization signal, resulting from a future signal,
    exclusive OR between a most significant bit of the current signal and a most significant bit of the future signal.

6. A computer program able to implement the signal conversion method as claimed in claim 5, when said program is executed by a processor.

* * * * *